United States Patent
Schwartz et al.

(10) Patent No.: US 7,733,979 B2
(45) Date of Patent: Jun. 8, 2010

(54) AVERAGE POWER CONTROL OF WIRELESS TRANSMISSION HAVING A VARIABLE DUTY CYCLE

(75) Inventors: Adam L. Schwartz, San Carlos, CA (US); James Christopher Arnott, Santa Clara, CA (US)

(73) Assignee: NDSSI Holdings, LLC, San Jose, CA (US)

( * ) Notice: Subject to any disclaimer, the term of this patent is extended or adjusted under 35 U.S.C. 154(b) by 652 days.

(21) Appl. No.: 11/726,288

(22) Filed: Mar. 21, 2007

(65) Prior Publication Data

US 2008/0232436 A1 Sep. 25, 2008

(51) Int. Cl.
*H04K 1/02* (2006.01)
(52) U.S. Cl. .................................... 375/297
(58) Field of Classification Search .................. 375/297
See application file for complete search history.

(56) References Cited

U.S. PATENT DOCUMENTS

| | | | |
|---|---|---|---|
| 5,694,431 A | 12/1997 | McCoy | |
| 5,896,368 A * | 4/1999 | Dahlman et al. | 370/335 |
| 6,286,994 B1 * | 9/2001 | Boesel et al. | 374/146 |
| 6,411,072 B1 | 6/2002 | Feldman | |
| 6,675,000 B1 * | 1/2004 | Ichikawa | 455/127.3 |
| 7,079,827 B2 | 7/2006 | Richards et al. | |
| 7,418,055 B2 * | 8/2008 | Wenzel et al. | 375/296 |
| 2005/0227646 A1 | 10/2005 | Yamazaki et al. | |
| 2006/0030352 A1 | 2/2006 | Kiran et al. | |
| 2006/0178163 A1 | 8/2006 | Richards et al. | |

* cited by examiner

*Primary Examiner*—Kevin Y Kim
(74) *Attorney, Agent, or Firm*—Brian R. Short

(57) ABSTRACT

A method an apparatus for controlling a transmission signal power level of a transmitter is disclosed. The method includes receiving a root-mean-squared target power level. A duty cycle of a transmission signal is determined that indicates power on and power off periods over a predetermined sensing interval. A transmission signal power level is sensed. The transmission signal power level is adjusted to be approximately equal to the target power level divided by the duty cycle.

18 Claims, 6 Drawing Sheets

AVERAGE POWER CONTROL OF WIRELESS TRANSMISSION HAVING A VARIABLE DUTY CYCLE

FIELD OF THE INVENTION

The invention relates generally to communication systems. More particularly, the invention relates to a method and apparatus for average power control of wireless transmission having a variable duty cycle.

BACKGROUND OF THE INVENTION

Ultra-wideband (UWB) modulation provides very low-powered, high data rate radio communications for transferring data using very wide modulation bandwidths. FIG. 1 shows a typical application of UWB communication links used for indoor wireless communications. Several transceivers, for example, transceivers 110, 120, 130, 140 are networked allowing high bandwidth communications between the transceivers 110, 120, 130, 140. The transceivers 110, 120, 130, 140 can include, for example, a high definition television (HDTV) monitor networked with other devices, such as, a digital video recorder (DVR), a digital video disk (DVD) player and a computing device.

The Federal Communications Committee (FCC) has mandated that UWB radio transmission can legally operate in the frequency range of 3.1 GHz to 10.6 GHz. The transmit power requirement for UWB communications is that the maximum average transmit Effective Isotropic Radiated Power (EIRP) is −41.3 dBm/MHz in any transmit direction averaged over any 1 mS interval.

Due to the lower transmit power levels required of UWB radio transmission, it is desirable to maximize the transmit power of the UWB transmission signals without exceeding the FCC mandated rules. Generally, SNR and associated communication transmission signal quality parameters improve with increased transmission signal power.

It is desirable to have a method and apparatus for providing high-power transmission signals within a UWB networking environment without exceeding FCC radiated power requirements.

SUMMARY OF THE INVENTION

An embodiment of the invention includes a method of controlling a transmission signal power level of a transmitter. The method includes receiving a root-mean-squared target power level. A duty cycle of a transmission signal is determined that indicates power on and power off periods over a predetermined sensing interval. A transmission signal power level is sensed. The transmission signal power level is adjusted to be approximately equal to the target power level divided by the duty cycle.

Another embodiment of the invention includes a UWB transmitter. The UWB transmitter includes a power detector for detecting an instantaneous power level of a transmission signal of the transmitter. An adjustable gain amplifier adjusts the instantaneous power level of the transmission signal. A controller receives a target power level, and sets the adjustable gain amplifier, wherein the instantaneous power level is substantially equal to the target power level divided by a duty cycle of the transmission signal.

Other aspects and advantages of the present invention will become apparent from the following detailed description, taken in conjunction with the accompanying drawings, illustrating by way of example the principles of the invention.

DETAILED DESCRIPTION

The invention includes an apparatus and method of controlling a transmission signal power level of a transmitter. More specifically, the embodiments described can be used to control the RMS average output power spectral density of a transmitter (for example, a UWB transmitter). Variations of the embodiments include the control depending on power detection, averaging and adjustments to the transmission signal power lever of the transmitter. These elements are used in implementations of power control algorithms that attempt to maintain a targeted output power level. In each cycle of the algorithm, a series of power measurements are taken and used to form an estimate of the transmitted power. This power is compared against a target power and the difference is used to adjust the power level.

RMS Power

The RMS power of a signal can be defined as:

$$p_{RMS} = \frac{1}{\tau} \int_{t_0}^{t_0+\tau} p(t)\,dt$$

where p(t) is the instantaneous power, τ is the duration of the RMS averaging and $t_0$ is an arbitrary starting time for the measurement. The terminology of root-mean-square is due to the fact that often it is voltage, rather than power, that is measured. In the case of voltage, the equivalent measurement is the square-root of the integral of the voltage squared. This distinction is unimportant and for the purposes of description, the uses of RMS voltage or average power are treated interchangeably.

Figure 2:
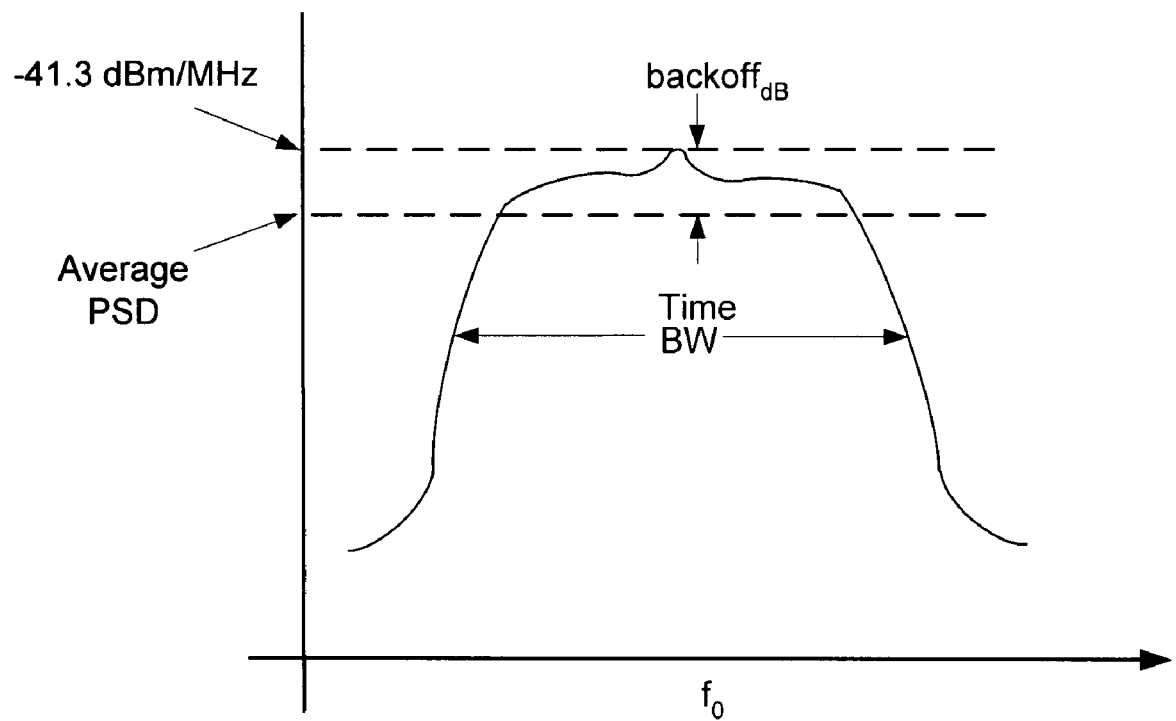
FIG. 2 shows one example of the power spectral density of a UWB signal in the frequency-domain.

FIG. 2 shows one example of the power spectral density of a UWB signal in the frequency-domain. The FCC and other regulatory bodies around the world require that the EiRP transmitted power of a UWB signal be no greater than −41.3 dBm/MHz anywhere within the allotted UWB spectrum when averaged over any 1 mS interval. It is well-known that the channel power of the signal (the PSD integrated over the bandwidth of the channel) is equal to the RMS power of a signal as previously described. Therefore, if the spectrum of the UWB is perfectly flat, then the PSD times the bandwidth is equal $p_{RMS}$. In other words, for a reasonably flat signal, i.e. PSD(f)≈$PSD_{avg}$ for $f_0-BW/2 \leq f \leq f_0+BW/2$, the RMS power of the transmission signal is:

$$p_{RMS} = \int_{f_0-BW/2}^{f_0-BW/2} psd(f)df \approx psd_{avg} \cdot BW$$

where $f_0$ is the center frequency of the signal, BW is its bandwidth (in Hz divided by the resolution bandwidth, in Hz, of the spectrum analyzer) and $psd(f)=10^{PSD(f)/10}$ and $psd_{avg}=10^{PSD_{AVG}/10}$ are, respectively, the PSD and its average expressed in linear units (such as milli-Watts/MHz).

Figure 1:
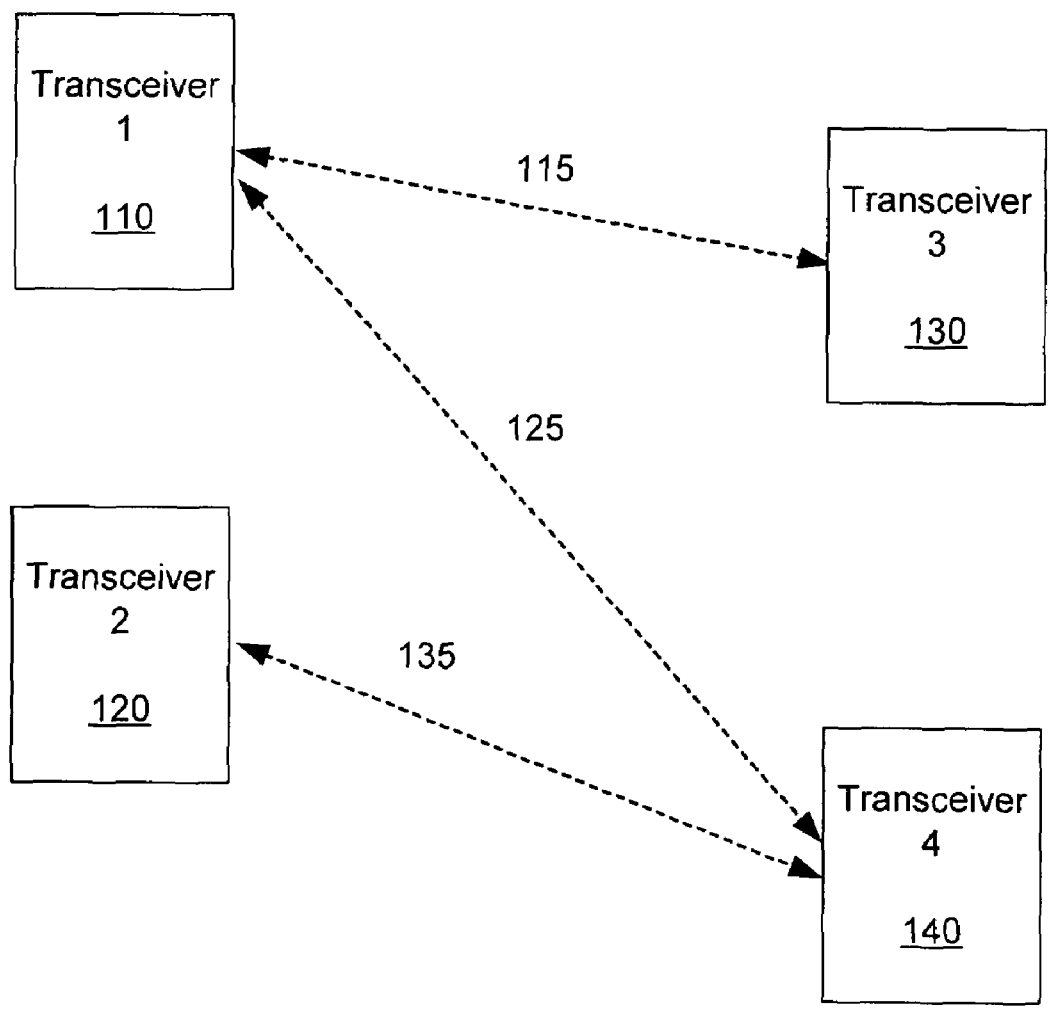
FIG. 1 shows a prior art UWB wireless network.

However, in a typically transmission system, the PSD is not flat and, worse, may contain spurs that extend above the average PSD. This deviation from being a flat spectrum is also shown in FIG. 1. The spectrum has some roll-off towards either end and there is a spur that extends upward. Thus, the average PSD is lower than the maximum of the PSD. From the plot we see that in order to keep the $\max_f PSD(f) \leq -41.3$ dBm/MHz we must set $PSD_{avg} = -41.3$ dBm/MHz$-$backoff$_{dB}$, where the backoff$_{dB}$ depends on how far the transmission signal power deviates from the ideal. The target power can be represented by:

$$p_{target} \approx \frac{psd_{avg} \cdot BW}{10^{back-off_{dB}/10}}$$

where $p_{target}$ is the power measured that ensures that the signal's PSD stays below the required regulatory limit. In operation, backoff$_{dB}$ can also be used to compensate for gain or loss between the point at which the signal power is measured and the signal radiated from the antenna or antennas.

Figure 3A:
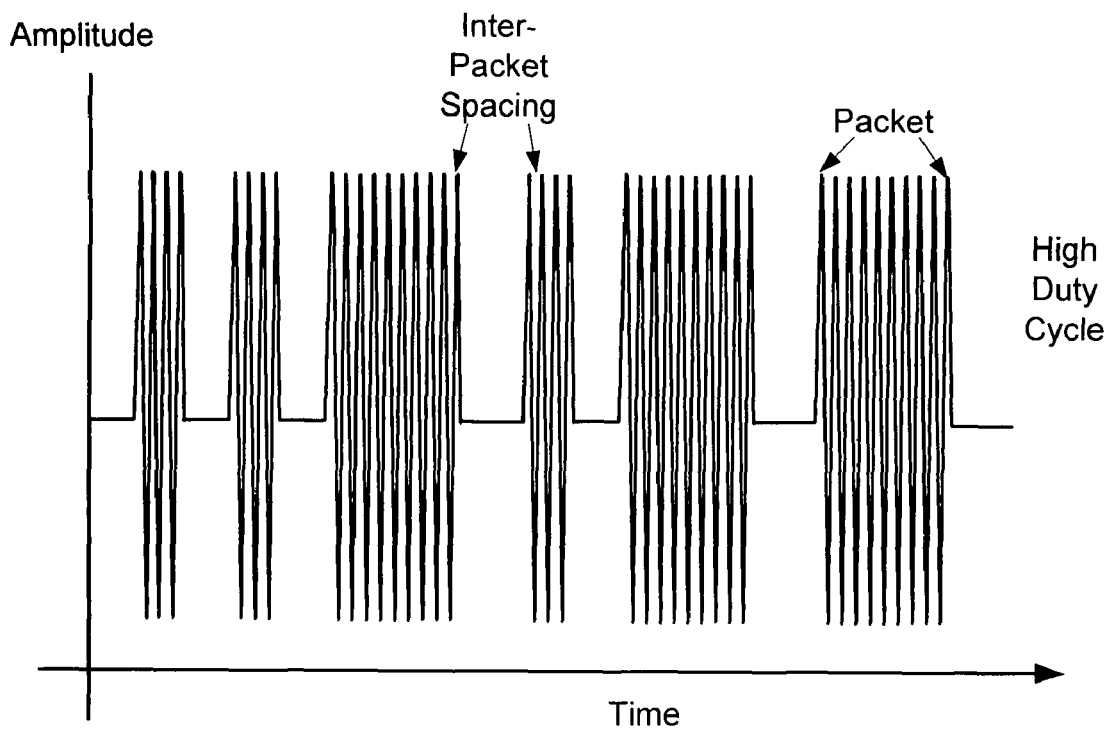
FIG. 3A shows an example of a high-duty cycle signal in the time-domain.

FIG. 3A shows an example of a high-duty cycle signal (high relative to the signal shown in FIG. 3B) in the time-domain. As shown, the exemplary transmission signal includes "on" periods of time (designated as "Packet") and "off" periods of time (designated as "Inter-Packet Spacing"). The duty cycle of the transmission signal can generally be estimated as the ratio of the "on" periods to the combination of the "on" periods and the "off" periods. For a UWB transmitter, the larger the duty cycle, the lower the target power level must be to satisfy the EiRP transmitted power regulations of UWB signals.

Figure 3B:
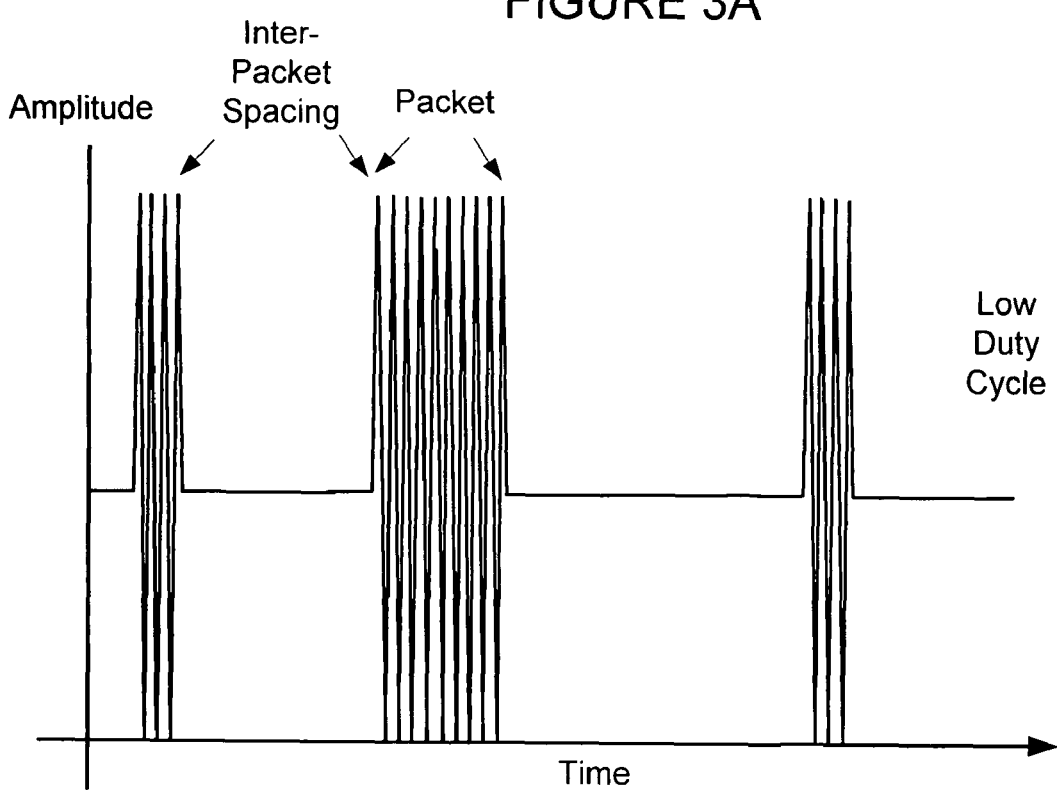
FIG. 3B shows an example of a low-duty cycle signal in the time-domain.

FIG. 3B shows an example of a low-duty cycle signal (low relative to the signal shown in FIG. 3B) in the time-domain. As shown, the exemplary transmission signal includes "on" periods of time (designated as "Packet") and "off" periods of time (designated as "Inter-Packet Spacing"). The duty cycle of the transmission signal can generally be estimated as the ratio of the "on" periods to the combination of the "on" periods and the "off" periods. For a UWB transmitter, the lower the duty cycle, the higher the target power level can be to satisfy the EiRP transmitted power restrictions of UWB signals.

Generally, the UWB signals are bursty. This means that the signal energy is composed of packets which are of different durations and separated by different amounts of time. Based on previously described equations, it can be determined that $p_{RMS}$ depends not only on the energy in the packets that are transmitted, but on the inter-packet spacing during which time nothing is transmitted. In effect, the duty-cycle, g, of the transmitted signal to the inter-packet spacing scales the average power. In other words, during any interval of $\tau$ seconds, $$p_{RMS} = g p_{packet}$$

where $p_{packet}$ is an instantaneous power measurement of the signal taken during the period of time while the transmission is actually occurring. If, during $\tau$ seconds, the signal is transmitted 75% of the time, and nothing is transmitted during the remainder of the $\tau$ seconds, then g=0.75 and the average power is only ¾ of the packet power. The determination of $p_{RMS}$ can be calculated in several different ways.

In some situations, the estimate of the instantaneous power can be improved by taking M power measurements during transmission of a packet and averaging those measurements. In this case, $$p_{packet} = \frac{1}{M} \sum_{m=1}^{M} p(t_m)$$

where $p(t_m)$ are power measurements taken within the period of time during which the transmission of a single packet is active.

Figure 4:
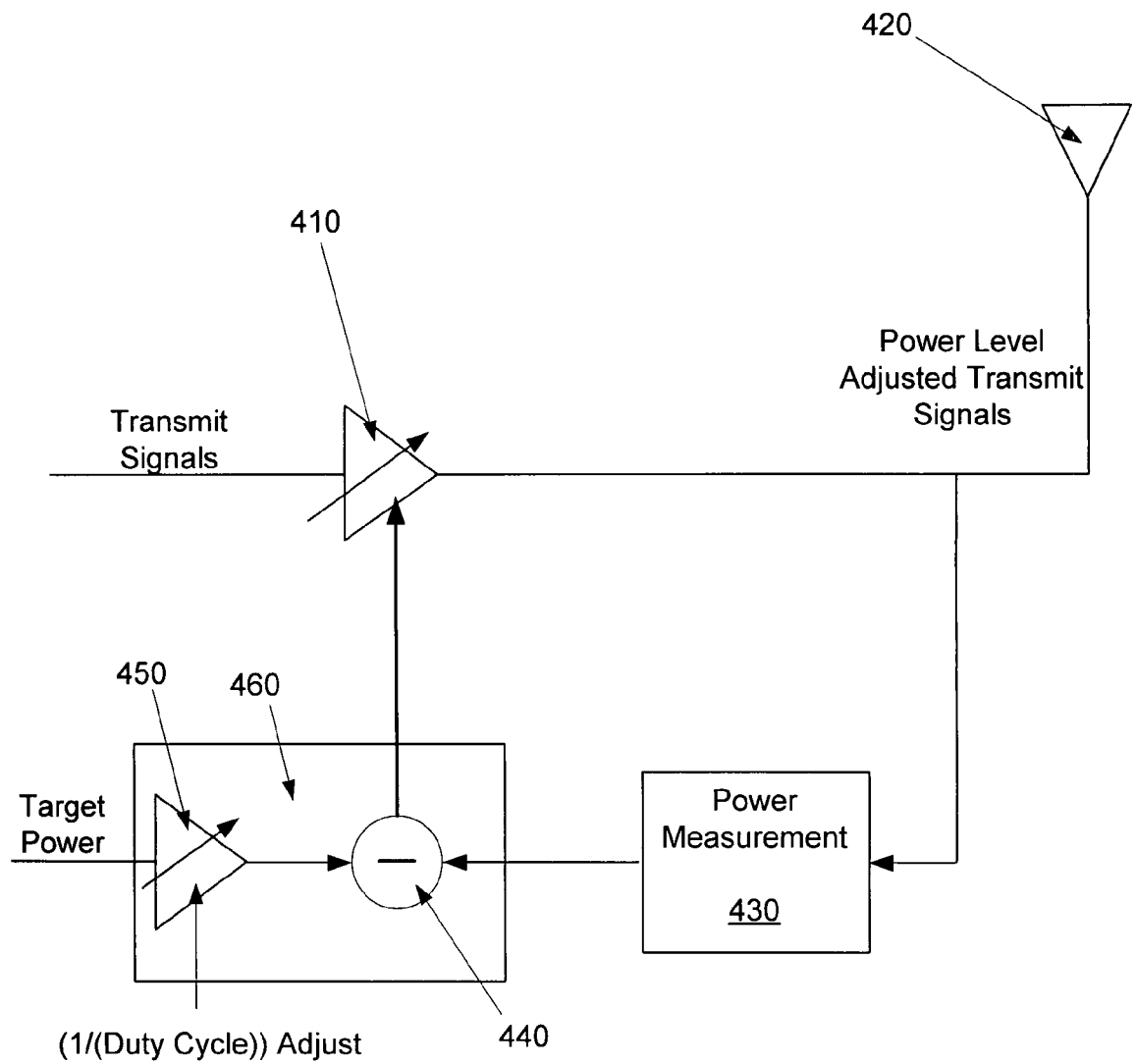
FIG. 4 shows an example of an embodiment of a transmitter using a duty cycle of transmission signals and a target power level to control output power of the transmission signals.

FIG. 4 shows an example of an embodiment of a transmitter using a duty cycle of transmission signals and a target power level to control output power of the transmission signals. The transmitter includes a power detector 430 for detecting an instantaneous power level of a transmission signal of the transmitter. An adjustable gain amplifier 410 adjusts the instantaneous power level of the transmission signal. A controller 460 receives a target power level, and sets the adjustable gain amplifier 410. The adjustable gain amplifier 410 is adjusted until the instantaneous power level is substantially equal to the target power level divided by a duty cycle of the transmission signal.

The controller 460 shown in FIG. 4, includes an adjustment (amplitude adjuster 450) to the target power level as determined by the duty cycle of the transmit signals. A summer 440 compares the instantaneous measure transmit signal power level as measured by the power detector 430 with the duty cycle adjusted target power. A closed feedback loop is formed by controlling the gain of the adjustable gain amplifier 410 with an output of the summer 440, forcing the instantaneous measure transmit signal power level to be substantially equal to the duty cycle adjusted target power level.

Figure 5:
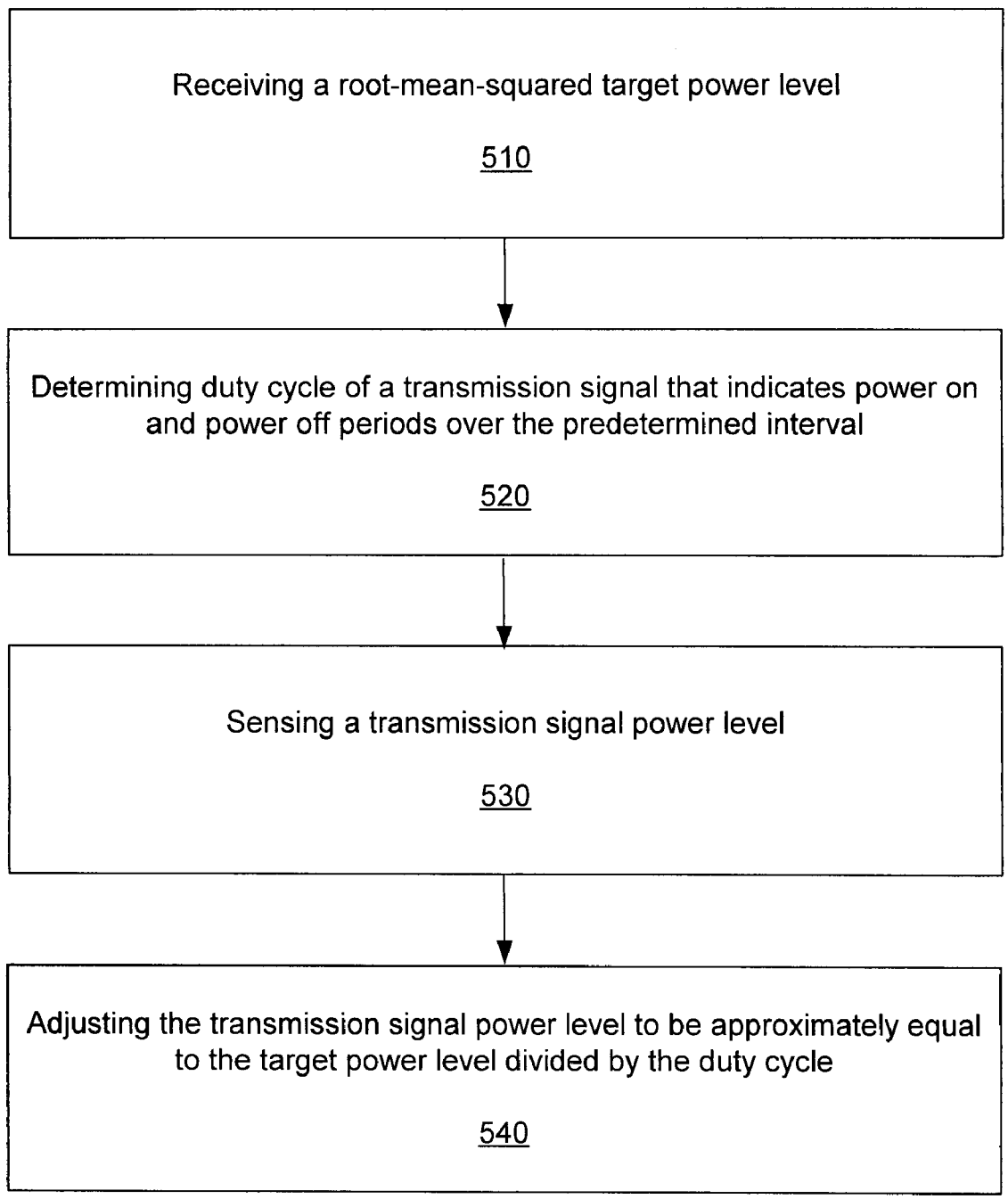
FIG. 5 is a flow chart that shows steps of one example of a method of controlling a transmission signal power level of a transmitter.

FIG. 5 is a flow chart that shows steps of one example of a method of controlling a transmission signal power level of a transmitter. A first step 510 of the method includes receiving, for example, a root-mean-squared target power level. A second step 520 includes determining duty cycle of a transmission signal that indicates power on and power off periods over a predetermined sensing interval. A third step 530 includes sensing a transmission signal power level. A fourth step 540 includes adjusting the transmission signal power level to be approximately equal to the target power level divided by the duty cycle.

Another embodiment further includes receiving a transmission indicator that is active during transmission of signals. This embodiment, further includes the transmission signal power level being sensed while the transmission indicator is active.

According to regulations of UWB signals, the root-mean-squared target power level is −41.3 dBm/MHz over a 1 mS period. Therefore, an embodiment includes the predetermined sensing interval is 1 mS.

Transmission Signal Power Level Adjustment

Various implementations of transmitters and methods can be used to adjust the transmission signal power level. As has been described, the transmission signal power level can be adjusted by an adjustable gain amplifier of a transmitter chain of the transmitter. The transmission signal power level can be adjusted after the predetermined sensing interval, or while the transmission indicator is inactive.

Sensing the Transmission Signal Power Level

As described, one embodiment includes sensing an instantaneous power level of the transmission signal. And, as mentioned above, the sensing of an instantaneous power level may itself include the average of M measurements within a packet. However, variations include sensing N transmission packets, and computing the instantaneous power level based upon the N sensed transmission packets (each of which may be the result of M averages within each packet). More specifically, one embodiment includes sensing the instantaneous power level of N transmission packets, and computing the instantaneous power level by detecting the maximum instantaneous power level of the N transmission packets. Mathematically, this can be expressed by:

$$p = \frac{1}{N}\sum_{n=1}^{N} p_{packet,n}.$$

where $p_{packet,n}$ designates the instantaneous power of the $n^{th}$ packet.

Another embodiment includes sensing the instantaneous power level of N transmission packets, and computing the instantaneous power level averaging the instantaneous power level of the N transmission packets. Generally, this smoothes output variations in the power measurement from packet to packet Mathematically, this can be expressed by:

$$p = \max_{n=1,\ldots,N} p_{packet,n}$$

The difference between the two approaches (maximum versus average) is that the first approach, by taking the maximum, provides a more conservative estimate of the RMS average power level.

Transmission Signal Duty Cycle

As previously described, the duty cycle of the transmission signal can be computed based on the power on-time divided by the sum of the power on-time and the power off-time over a predetermine duration of time (such as, 1 mS). For other embodiment, the duty cycle of the transmission signal can be provided by a transmission scheduler. That is, the transmission of UWB signals is typically controlled by a transmission scheduler that determines when and for how long the UWB transmitter is transmitting UWB signals. An estimate of the duty cycles of the transmission signals can be made based on knowledge of the transmission times and durations.

Course and Fine Gain Adjustments

An embodiment of the adjustable gain amplifier includes course gain adjustment settings and a fine gain adjustment. The course adjustment settings can be controlled by the scheduler, and the fine gain adjustment is controlled to maintain the transmission signal power level. This embodiment can be useful if large changes in the gain (as dictated by significant changes in duty-cycle) are better implemented in a separate, course-adjustable gain stage.

Figure 6:
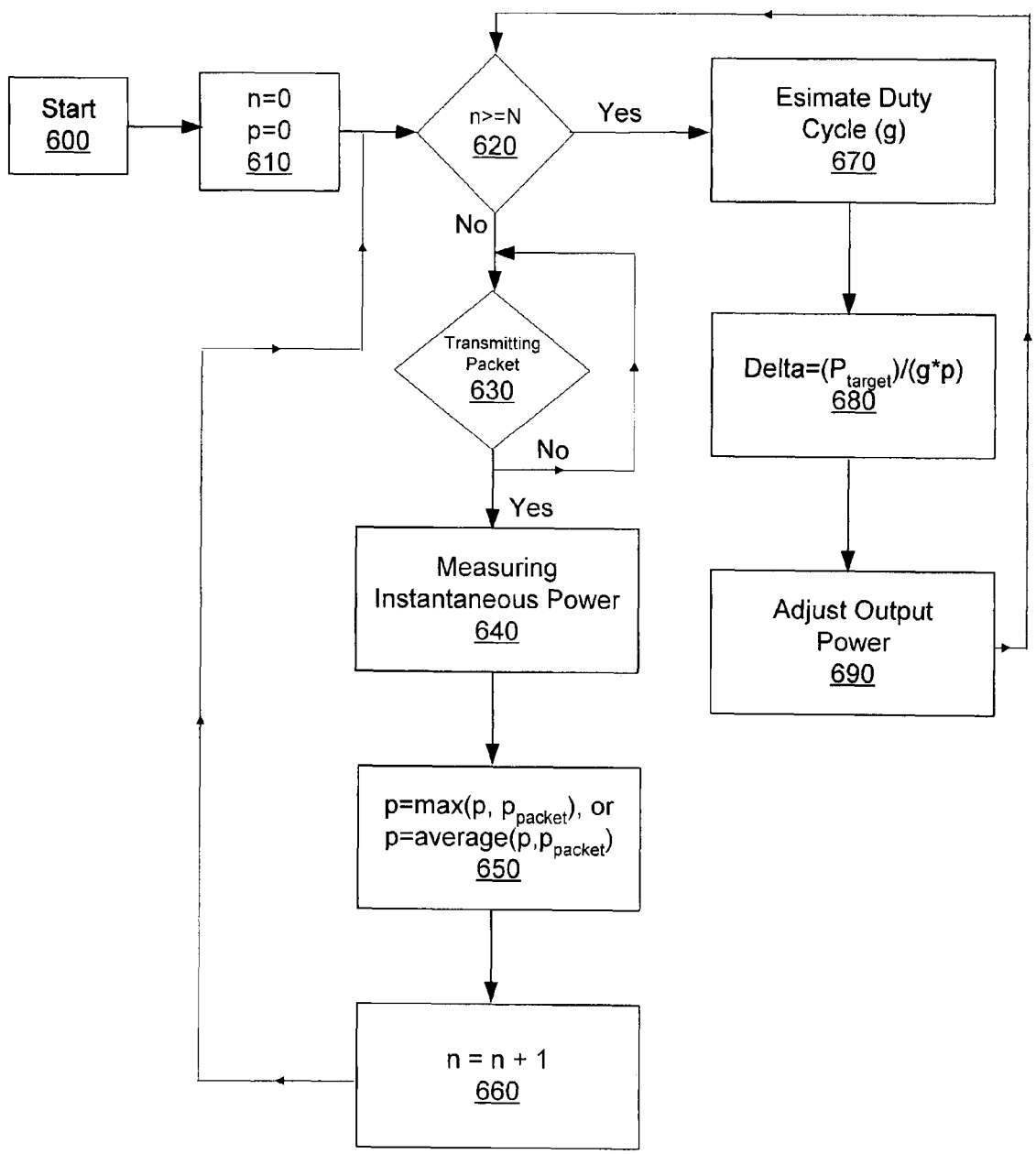
FIG. 6 is a flow chart that shows the steps of one example of a method of setting the transmission signal power level of a UWB transmitter.

FIG. 6 is a flow chart that shows the steps of one example of a method of setting the transmission signal power level of a UWB transmitter. The method starts at 600. At step 610, the number of packets to be evaluated is set to zero (n=0), and the power estimate is given an initial value of zero (p=0). At step 620, it is determined whether n>=N (N sets of number of packets to be evaluated). Step 630 includes determining whether a packet is being transmitted. If yes, step 640 includes measuring the instantaneous power level of the packet ($p_{packet}$). Step 640 may or may not include the intra-packet averaging as previously discussed. Step 650 includes averaging the instantaneous power level, or averaging the inter-packet power level measurements or tracking the maximum of the inter-packet instantaneous power level measurements depending on which of the previously described embodiments is implemented. Step 660 includes incrementing the packet number n. When n>=N, then a step 670 is executed which includes determining the duty cycle of the transmission signal. Step 680 includes determining a difference (Delta) between $P_{target}$ divided by the duty-cycle and the power computed by step 650. Step 690 includes adjusting the power level of the transmission signal in order to force the Delta to be close to one, indicating that $P_{target}$ is equal to the duty cycle (g) multiplied by the instantaneous power. If for example, g=0.5, then $p_{packet}$ is forced to be $2*P_{target}$.

Although specific embodiments of the invention have been described and illustrated, the invention is not to be limited to the specific forms or arrangements of parts so described and illustrated. The invention is limited only by the appended claims.

What is claimed:

1. A method of controlling a transmission signal power level of a transmitter, comprising:
   receiving a target power level;
   determining duty cycle of a transmission signal that indicates power on and power off periods over a predetermined sensing interval;
   sensing a transmission signal power level;
   adjusting the transmission signal power level to be approximately equal to the target power level divided by the duty cycle:
   receiving a transmission indicator that is active during transmission of signals;
   at least sensing the transmission signal power level while the transmission indicator is active.

2. The method of claim 1, wherein the target power level is a root-mean-squared target power level of −41.3 dBm/MHz over a 1 mS period.

3. The method of claim 1, wherein the predetermined sensing interval is 1 mS.

4. The method of claim 1, wherein the transmission signal power level is adjusted by an adjustable gain amplifier of a transmitter chain of the transmitter.

5. The method of claim 1, wherein the transmission signal power level is adjusted after the predetermined sensing interval.

6. The method of claim 1, wherein the transmission signal power level is adjusted while the transmission indicator is inactive.

7. The method of claim 1, wherein sensing a transmission signal power level of the transmission signal comprises:
   taking M measurements of a power level of a transmission packet;
   computing a first instantaneous power level by averaging the M measurements.

8. The method of claim 7, further comprising computing a second instantaneous power level of the transmission signal, comprising:
   sensing the first instantaneous power level of N transmission packets; and computing the second instantaneous power level by detecting the maximum of the first instantaneous power levels of the N transmission packets.

9. The method of claim 7, further comprising computing a second instantaneous power level of the transmission signal, comprising:
   sensing the first instantaneous power level of N transmission packets; and
   computing the second instantaneous power level by averaging the first instantaneous power levels of the N transmission packets.

10. The method of claim 1, wherein the duty cycle of the transmission signal is computed based on the power on-time divided by the sum of the power on-time and the power off-time.

11. The method of claim 1, wherein the duty cycle of the transmission signal is provided by a transmission scheduler.

12. The method of claim 4, wherein the adjustable gain amplifier comprises course gain adjustment settings and a fine gain adjustment.

13. The method of claim 12, wherein the course adjustment settings are controlled by a scheduler, and the fine gain adjustment is controlled to maintain the transmission signal power level.

14. A UWB transmitter comprising:
   a power detector for detecting an instantaneous power level of a transmission signal of the transmitter;
   an adjustable gain amplifier for adjusting the instantaneous power level of the transmission signal;
   a controller for receiving a target power level, and setting the adjustable gain amplifier, wherein the instantaneous power level is made substantially equal to the target power level divided by a duty cycle of the transmission signal;
   taking M measurements of a power level of a transmission packet;
   computing a first instantaneous power level by averaging the M measurements;
   wherein sensing the instantaneous power level of the transmission signal, comprises:
      sensing the first instantaneous power level of N transmission packets; and
      computing the instantaneous power level by detecting the maximum first instantaneous power level of the N transmission packets.

15. A UWB transmitter comprising:
   a power detector for detecting an instantaneous power level of a transmission signal of the transmitter;
   an adjustable gain amplifier for adjusting the instantaneous power level of the transmission signal;
   a controller for receiving a target power level, and setting the adjustable gain amplifier, wherein the instantaneous power level is made substantially equal to the target power level divided by a duty cycle of the transmission signal;
   taking M measurements of a power level of a transmission packet;
   computing a first instantaneous power level by averaging the M measurements;
   wherein sensing the instantaneous power level of the transmission signal, comprises:
      sensing the first instantaneous power level of N transmission packets; and
      computing the instantaneous power level averaging the first instantaneous power level of the N transmission packets.

16. The transmitter of claim 14, wherein the duty cycle of the transmission signal is computed based on the power on-time divided by the sum of the power on-time and the power off-time.

17. The transmitter of claim 16, wherein the duty cycle of the transmission signal is provided by a transmission scheduler.

18. The transmitter of claim 14, wherein the target power level is a root-mean-squared target power level of −41.3 dBm/MHz over a 1 mS period.

* * * * *